Feb. 8, 1955

R. C. PALMER 2,701,851

AMPLIFIER

Filed Aug. 30, 1952

INVENTOR.
RICHARD C. PALMER

BY Darby & Darby

ATTORNEYS

United States Patent Office 2,701,851

Patented Feb. 8, 1955

2,701,851

AMPLIFIER

Richard C. Palmer, Pompton Plains, N. J., assignor to Allen B. Du Mont Laboratories, Inc., Clifton, N. J., a corporation of Delaware Application August 30, 1952, Serial No. 307,199

9 Claims. (Cl. 315—27)

Figure 1:
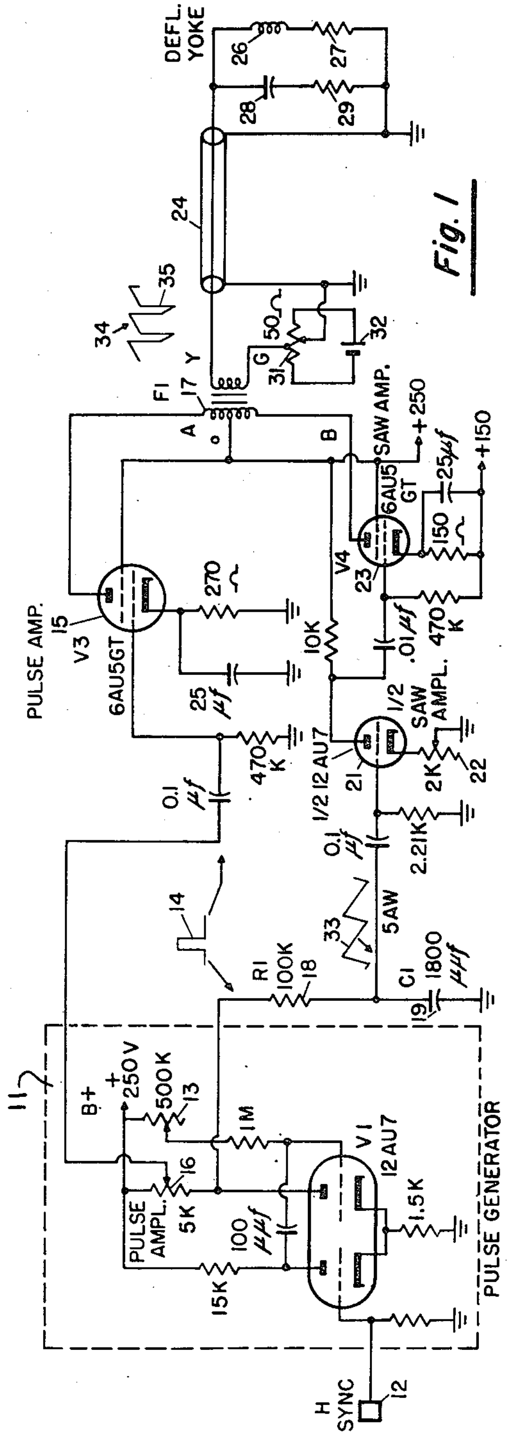

This invention relates to electrical amplifier circuits and particularly to circuits for amplifying the complex wave-form required to generate sawtooth deflection current in magnetic deflection coils.

It is well known that the voltage required to drive a sawtooth-shaped current wave through a series circuit comprising an inductance and a resistance has the form of a sawtooth wave plus a pulse wave with the pulse being timed to coincide with the retrace period of the sawtooth wave, and extending in the same sense as the retrace. The overall amplitude of the wave is, therefore, somewhat greater than the amplitude of the sawtooth portion alone, and if it is desired to amplify such a wave without distortion, it is necessary to provide an amplifier having a wider permissible voltage swing than would be the case for the sawtooth component or the pulse component alone. Providing such an amplifier, however, is somewhat wasteful of power supply energy since the capacity required to handle the pulse portion is utilized for only a small fraction of each cycle of operation.

The present invention provides a circuit for giving the desired output wave without utilizing a wide swing amplifier, thereby reducing power dissipation and permitting use of lower voltage power supplies. For this purpose, two separate amplifiers are provided, one for the pulse portion and one for the sawtooth portion and their output waveforms are combined in such a way as to generate the required complex waveform. By so doing, rigorous requirements for linearity in the complete amplifier are reduced, and overall linearity is improved, since the pulse-portion amplifier may be non-linear, and the sawtooth-portion amplifier need be linear only for a smaller range of amplitude variation where better linearity is readily attainable.

One object of this invention is to provide an improved amplifier circuit for sawtooth wave-forms.

Other objects are to reduce the power dissipation in an amplifier for magnetic deflection circuits and to improve the linearity of operation of sawtooth deflection amplifiers.

Figure 2:
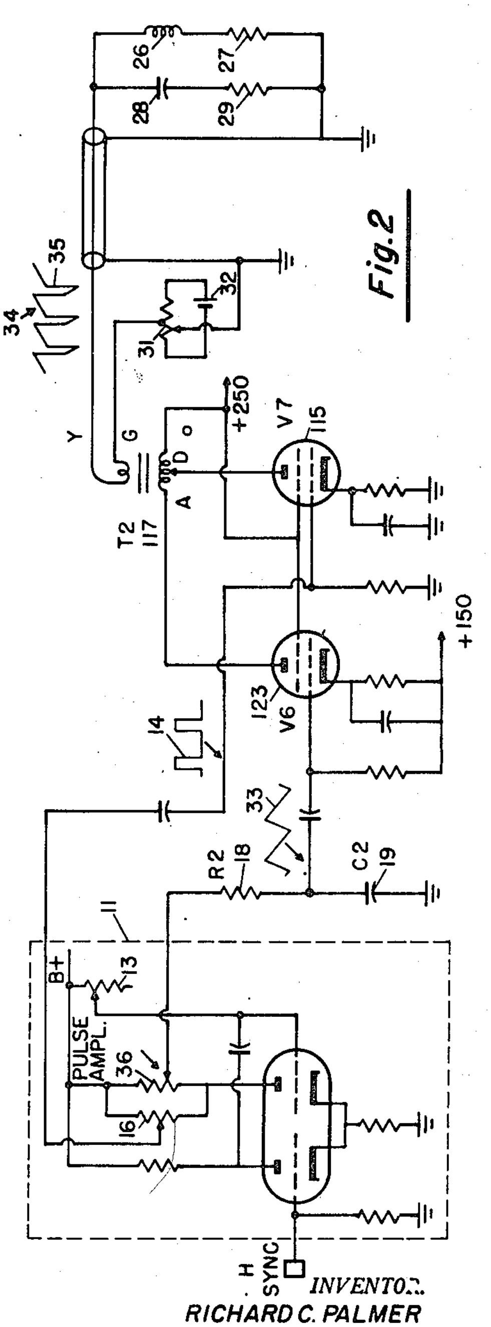

Still further objects will be apparent after reading the following specification together with the drawing in which:

Figure 1 is a schematic diagram of a deflection amplifier utilizing the invention, and Figure 2 is a similar diagram of a different embodiment of the invention.

In accordance with the invention an impulse voltage wave having a repetitive sequence of sharp pulses, such as rectangular or peaked pulses, is applied to the input circuits of two amplifiers. In one of these amplifiers the impulse wave is transformed into a sawtooth-shaped wave; while the other amplifier passes the pulse wave along substantially without change, except in magnitude. The output circuits of the two amplifiers are coupled together by means of the horizontal deflection transformer in such polarity as to provide the necessary sawtooth-plus-pulse wave for use in a magnetic deflection circuit.

In the circuit in Figure 1, a pulse generator 11 is supplied with a synchronizing waveform from a synchronizing generator 12. The pulse generator 11 comprises a multivibrator with a control 13 to adjust the duty cycle of the output signal, which is shown as wave 14. Circuit 11 is conventional, and may be replaced by any equivalent or similar circuit for generating a pulsed wave form in response to a synchronizing voltage. The pulse generator circuit 11 has two outputs, one being derived directly from the right plate of the pulse generator tube, and the second from the variable arm of a gain control potentiometer 16 in the circuit of that plate whereby the second output may be adjusted in magnitude.

An amplifier tube 15 has its input circuit coupled to the arm of gain control potentiometer 16, and has its output circuit connected to a winding A0 of a transformer 17 which is in series between the plate voltage supply and the plate of tube 15.

An RC series circuit comprising a resistor 18 and a condenser 19 is connected to the right plate of the pulse generator 11, and the voltage across the condenser 19 is fed conventionally to an amplifier tube 21. Tube 21 is provided with a gain control rheostat 22 in its cathode circuit. The plate of tube 21 is connected to the input circuit of an amplifier tube 23, the output circuit of which is connected to a second input winding B0 of transformer 17. An output winding YG of the same transformer is connected by means of a shielded or coaxial cable 24 to the deflection yoke 26.

In order to improve the transmission characteristics of the cable, as will be discussed more fully later, the deflection yoke 26 is connected in series with a resistor 27 and this series circuit is connected in parallel with another series circuit comprising a condenser 28 and a resistor 29. A conventional centering circuit comprising a center tapped potentiometer 31 and a battery 32 is connected in series with the winding YG of transformer 17.

In the operation of the circuit in Figure 1, voltage impulses 14 are generated in synchronism with the signal generated in source 12. These impulses 14 are amplified and inverted in the tube 15. Normally the tube 15 is biased so that it conducts only during the positive peaks of pulses 14, thereby reducing the power dissipation and increasing the efficiency of tube 15.

The pulses 14 are also applied to the RC circuit 18, 19. The parameters of this circuit are chosen to integrate the pulses 14 into a sawtooth voltage waveform 33, which is linearly amplified and inverted by the tube 21 and passed on to tube 23 at a magnitude determined by the gain control 22. Tube 23 linearly amplifies the sawtooth wave 33 still more and inverts it again, back to its original polarity.

Since it is desired to obtain complex sawtooth-plus-pulse voltage waveform 34 in the output winding YG of transformer 17, it is necessary to polarize the winding A0 properly with respect to winding B0. The pulse portion 35 of waveform 34 is shown negatively polarized, which corresponds to the polarity of the output wave from tube 15, but the sawtooth portion is polarized oppositely to the output wave of tube 23. The proper polarization for generating wave 34 is obtained by connecting the terminal 0 to a fixed potential point such as the B+ potential.

Although it is not essential to the invention that the wave 34 be transmitted any great distance before being applied to the deflection yoke 26, under certain conditions a long transmission path is necessary, and in such cases a coaxial transmission line may be used. Under other conditions, the transmission path may not be outstandingly long but shielding requirements may make a coaxial line desirable. In either case, it is well known that coaxial transmission lines should be terminated in their characteristic impedances. Since the characteristic impedance is normally a pure resistance, means must be provided to compensate for the inductive reactance of the deflection yoke over the wide frequency band inherent in the sawtooth shaped current waveform. It is well known that one circuit for compensating for inductive reactance while maintaining a large bandwidth (theoretically infinite band width) has the form of a parallel circuit comprising the inductance to be compensated and the resistance in one leg and a capacitance and resistance in the other leg. The components of this parallel circuit must have a preferred magnitude if the circuit is to work. This relationship between the components requires the two resistors 27 and 29 to be of equal magnitude and the capacitance 28 to be given by the following equation:

$$R_{27}=R_{29}=\sqrt{\frac{L_{26}}{C_{28}}}$$

where L is in henries, C is in farads, and R is in ohms.

Under these conditions, the bandwidth of the circuit is infinite and its impedance is simply R where R is the magnitude of each of the resistors 27 and 29.

This form of compensation is used in the circuit of Figure 1, where the capacitance of condenser 28 and the resistance of resistors 27 and 29 are chosen in relation to the inductance of yoke 26, in accordance with the preceding equation.

The circuit in Figure 2 represents a different embodiment of the invention, in which tube 21 is omitted, and the remaining elements are modified slightly to provide the same results as in Figure 1. The same synchronizing source 12 and pulse generator 11 are used, and the pulse amplifier 115 (corresponding to amplifier 15 of Figure 1) is connected to the pulse generator 11 by means of the potentiometer 16 just as in Figure 1.

The amplifier 123 (corresponding to amplifier 23 of Figure 1) is coupled directly to the condenser 19 in this embodiment and amplitude control is obtained by a potentiometer 36 in parallel with potentiometer 16 in the circuit of generator 11. The waveform of the voltage in the output circuit of tube 123 will be of polarity opposite to that of the waveform at the output circuit of tube 23 in Figure 1, so that it is necessary to provide different connections to the output transformer 117 to which tubes 115 and 123 are connected. In that case, the winding A0 is tapped at the point D, to which the plate of tube 123 is connected, and winding B0 of Figure 1 is omitted. The output circuit of the transformer 117 is identical with the output circuit of the transformer 17 in Figure 1, and description thereof need not be repeated.

It has been found by experimentation that the preferred turns ratio for the windings for the transformer 17 in Figure 1 is 5:3.5:1 for the ratio of the number of turns of windings A0 to B0 to YG. Correspondingly, in Figure 2 the same turns ratio would apply to windings A0 to D0 to YG in order that the magnitude of the pulse portion of waveform 34 should have the same ratio with respect to the magnitude of the sawtooth portion.

Other embodiments of the invention may occur to those skilled in the art and the exact magnitudes of the components are given simply to illustrate a workable embodiment of the invention and are not to be constructed as to limit the scope thereover. The scope is to be determined only by the following claims.

I claim as my invention:

1. A deflection circuit for generating a sawtooth current in a magnetic deflection coil, said circuit comprising a source of impulse voltage; a sawtooth voltage generating circuit connected to said source to be energized thereby; a transformer coupled to said impulse voltage source and to said sawtooth voltage generating circuit to form a complex voltage waveform consisting of a sawtooth portion and an impulse portion, said coil being connected to said transformer to be energized by said complex voltage; and compensating elements connected to said deflection coil and co-acting therewith to form a substantially resistive impedance for said transformer.

2. A deflection circuit for generating a sawtooth current in a magnetic deflection coil, said circuit comprising a source of impulse voltage; a first amplifier connected to said source to amplify said voltage; a sawtooth voltage generating circuit connected to said source to be energized thereby; a second amplifier connected to said last-named circuit to amplify said sawtooth voltage; a transformer having a first winding connected to the output of said first amplifier to be energized thereby, a second winding connected to the output of said second amplifier to be energized thereby, a third winding connected to said deflection coil, said first and second windings being polarized to add a negative-going impulse to the negative-going retrace portion of said sawtooth voltage; and compensating elements connected to said deflection coil and co-acting therewith to form a terminating impedance for said third winding, said impedance being substantially resistive.

3. The circuit of claim 2 in which said second winding is a portion of said first winding.

4. The circuit of claim 2 in which said second winding is polarized opposite to said first winding and a third amplifier is connected between said sawtooth voltage generator and said second amplifier to invert said sawtooth voltage.

5. A deflection circuit for generating a sawtooth current in a magnetic deflection coil, comprising a transformer having an output winding coupled to said deflection coil, and an input winding having an intermediate tap terminal, a source of sawtooth voltage coupled between said tap terminal and one end terminal of said input winding, a source of pulse voltage coupled between the other end terminal of said input winding and one of the other terminals of said input winding, the pulses of said pulse voltage being substantially synchronous with the retrace portions of said sawtooth voltage, and compensating elements connected to and co-acting with said coil to form a substantially resistive impedance for said output winding.

6. A circuit as in claim 5, wherein said pulse voltage source is coupled between the two end terminals of said input winding.

7. A circuit as in claim 5 wherein said pulse voltage source is coupled between one end terminal and said tap terminal of said input winding.

8. A deflection circuit for generating a sawtooth current in a magnetic deflection coil, comprising a source of pulse voltage, means coupled to said source to generate a sawtooth voltage, separate amplifier means for said two voltages coupled respectively to said source and to said generating means, a transformer for combining the outputs of said separate amplifier means with the pulses of said pulse voltage synchronized with the retrace portions of said sawtooth wave and extending in the same sense as the direction of change of said retrace portions, and a substantially resistive network connected to an output winding of said transformer, said network comprising said deflection coil and compensating elements connected thereto.

9. A deflection circuit as in claim 8, wherein only the amplifier means for said sawtooth voltage is linear.

References Cited in the file of this patent

UNITED STATES PATENTS

| | | |
|---|---|---|
| 2,315,073 | Norton | Mar. 30, 1943 |
| 2,492,090 | Bass | Dec. 20, 1949 |
| 2,536,853 | Moore | Jan. 2, 1951 |
| 2,559,525 | Vance | July 3, 1951 |
| 2,633,555 | Tourshon | Mar. 31, 1953 |